United States Patent
Pedersen et al.

(10) Patent No.: US 8,028,013 B2
(45) Date of Patent: Sep. 27, 2011

(54) FAST FILTERING MEANS AND FILTERING AND DECIMATION METHODS

(75) Inventors: Kim Rishøj Pedersen, Egå (DK); Lars Arknæs-Pedersen, Viby J (DK)

(73) Assignee: The TC Group A/S (DK)

( * ) Notice: Subject to any disclaimer, the term of this patent is extended or adjusted under 35 U.S.C. 154(b) by 1078 days.

(21) Appl. No.: 10/591,197

(22) PCT Filed: Mar. 2, 2004

(86) PCT No.: PCT/DK2004/000140
§ 371 (c)(1),
(2), (4) Date: May 16, 2007

(87) PCT Pub. No.: WO2005/086346
PCT Pub. Date: Sep. 15, 2005

(65) Prior Publication Data
US 2007/0241806 A1    Oct. 18, 2007

(51) Int. Cl.
*G06F 17/10*    (2006.01)
(52) U.S. Cl. .................. 708/300; 708/319; 708/320
(58) Field of Classification Search .................. 708/313, 708/319, 300, 320
See application file for complete search history.

(56) References Cited

U.S. PATENT DOCUMENTS 5,511,015 A * 4/1996 Flockencier ................. 708/420
5,838,600 A * 11/1998 McNeely et al. ............ 708/301

OTHER PUBLICATIONS

International Search Report; PCT/DK2004/000140; Oct. 22, 2004.
Shen J et al: "Sum-box technique for fast linear filtering" Signal Processing, Amsterdam, NL, vol. 82, No. 8, Aug. 2002, pp. 1109-1126, XP004367262; ISSN: 0165-1684, paragraph '0005!

* cited by examiner

*Primary Examiner* — Chuong Ngo
(74) *Attorney, Agent, or Firm* — Cantor Colburn LLP

(57) ABSTRACT

The invention relates to a hardware implemented filtering method including establishing a representation DIS of the derivative of at least a part of a time-quantized input signal IS, and establishing at least one sample of a time- and amplitude-quantized output signal OS by performing filtering on the basis of at least a part of a filter representation IFC1, IFC2, IFC3 and the representation DIS of the derivative of at least a part of the input signal IS. The invention further relates to a hardware implemented decimation method for decimating a time-quantized input signal IS including dividing the time-quantized input signal IS into intervals, for each of the intervals establishing a sample of a time- and amplitude-quantized output signal OS according to the above mentioned filtering method. The invention further relates to a fast filtering means FFM implementing the above-mentioned methods.

34 Claims, 6 Drawing Sheets

FAST FILTERING MEANS AND FILTERING AND DECIMATION METHODS

FIELD OF THE INVENTION

Figure 1:
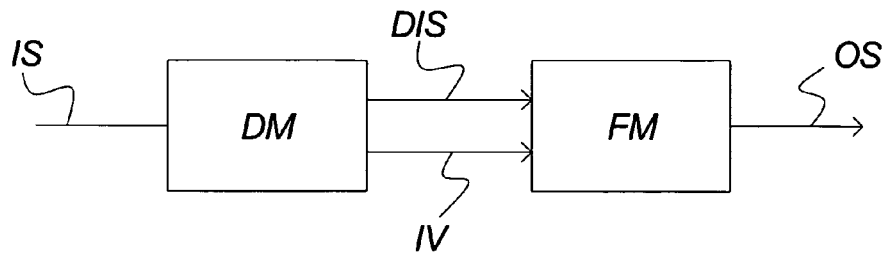

The present invention relates to a hardware implemented filtering method, embodiments of which, among others, comprise fast filtering means in particular fast FIR filtering means and decimation means.

BACKGROUND OF THE INVENTION

It is a well-known fact that decimation of a signal without corresponding filtering, e.g. anti-aliasing or low-pass filtering, may cause the decimated signal to be distorted or otherwise damaged.

Conventional FIR-filtering is usually performed by convolving a finite number of impulse response coefficients h[k] of a desired FIR-filter with an equivalent number of samples from the input signal x[n] in order to establish one sample of the output signal y[n]:

$$y[n] = h[k] * x[n] = \sum_{k=0}^{N-1} (h[k] \cdot x[n-k]),$$

where N is the length of the impulse response h[n].

Thus, for each output sample, N multiplications and N−1 additions have to be made. For practically all signal processors multiplications form a bottleneck and with a FIR filter having a resolution of, e.g., 384 coefficients, i.e. an N of 384, this results in 384 multiplications per sample. When the sample rate of the input signal is high, e.g. 200 MHz and the filtering is performed on each sample these 384 multiplications should be carried out within less than 5 nanoseconds. This is practically impossible or requires at least extremely expensive and demanding signal processing means. Also, when the FIR filter to be applied is very complex, e.g. having thousands of coefficients or very high-precision coefficient values it may be almost impossible or at least require excessive processing power It is an object of the present invention to provide a method for applying a filter to a signal in such a way that less processing power or time is needed for the filtering, e.g. for use with signals of a relatively high frequency, e.g. 200 MHz, or for relatively advanced filters.

It is a further object of the present invention to provide the option of decimating the signal rate to a lower frequency, e.g. 1.5 MHz or 384 kHz.

SUMMARY OF THE INVENTION

The present invention relates to a hardware implemented filtering method comprising the steps of
establishing a representation DIS of the derivative of at least a part of a time-quantized input signal IS, and
establishing at least one sample of a time- and amplitude-quantized output signal OS by performing filtering on the basis of at least a part of a filter representation IFC1, IFC2, IFC3 and said representation DIS of the derivative of at least a part of said input signal IS.

According to the present invention, an advantageous method for filtering an input signal IS is provided whereby the derivative DIS of the input signal is processed rather than the original input signal. The method of the present invention may be used for processing any kinds of input signals but its advantages are especially remarkable when there are only few changes of the input signal value over time relative to the sample rate or resolution. Such signals are in the following referred to as infrequently changing signals and may, e.g., be characterized by averagely 10, 50 or several hundred samples between each signal value change. As examples of signals that are typical infrequently changing may, e.g., be mentioned pulse width modulated PWM signals, pulse density modulated PDM signals, and pulse position PPM modulated signals.

The input signal IS may according to a preferred embodiment be received in a sampled form or the method of the present invention may comprise a step of latching or any other kind of sampling somewhere prior to the step of convolving the input signal derivative with the filter representation. Alternatively, the input to the method of the present invention may already be the derivate of an input signal or part of it and the first step of the present invention is then to adapt the input into a representation compatible with the subsequent steps of the present invention. This may, e.g., comprise sampling, re-sampling, modulation or coding scheme conversion, etc.

By the derivative DIS of at least a part of a time-quantized input signal IS is referred to a difference signal established from the input signal, i.e. the equivalent of a differentiated signal in the continuous time domain. It is noted that the method of the present invention not necessarily requires the derivative of the input signal to actually be established but only some kind of representation of it. Derivatives of infrequently changing signals comprise, e.g., relatively many zeroes and a beneficial representation of such a derivative is to register only the times where the derivative is non-zero.

The establishment of the representation DIS of the input signal derivative may be carried out by any suitable method, e.g. by actually establishing the full, mathematically differentiated signal or by only registering changes of the input signal and indexing those or by any other method. Preferably, only a part of the input signal corresponding to the length of the filter representation or the part of it is processed at a time.

The filter representation IFC1, IFC2, IFC3 or part of it may be established as a set of filter coefficients, one or more filter representing polynomials, or any other way of representing a filter. The filter representation may represent a filter in any way, e.g. by its impulse response, its integrated or accumulated impulse response, its differentiated impulse response, or any other direct or indirect constitution of a filter.

The filtering of the input signal derivative DIS is, preferably, performed by a kind of convolution process that is especially advantageous over a full convolution when the input signal derivative DIS comprises several zeroes, i.e. the input signal IS is an infrequently changing signal. The output signal OS is, preferably, of a PCM signal type.

According to the present invention, the filtering method may be hardware implemented e.g. in an integrated circuit, in a programmable logic device (PLD) or programmable gate array (PGA), e.g. a complex programmable logic device (CPLD), an application specific integrated circuit (ASIC), a very large scale integration chip (VLSI-chip), a field programmable gate array (FPGA) etc., in a programmable processor, e.g. a digital signal processor (DSP), central processing unit (CPU), by logic gates and circuitry, as software in a computer, any combination of the above, or in any other suitable way.

The present invention further relates to a hardware implemented method of convolving in the time domain an input signal x[n] with an impulse response h[k] in order to establish an output signal y[n], characterised by that said output signal y[n] is provided at least partly by a convolution in the time domain of a difference signal representation x'[n] of said input signal x[n] and a sum representation l[k] of said impulse response h[k].

According to the present invention, an advantageous convolution method is obtained which is particular beneficial for use with infrequently changing input signals as the difference signal established from an infrequently changing signal mostly comprises zeroes.

According to the present invention the output signal y[n] is, thus, at least partly provided by exercising x'[n]*l[k]

The difference signal representation x'[n] relates to the input signal x[n] in a way analogous to the way a differentiated signal in the continuous time domain corresponds to the signal it is derived from and may, e.g., be expressed as:

$$x'[n]=x[n]-x[n-1]$$

The sum representation l[k] relates to the impulse response h[k] in a way analogous to the way an integrated signal in the continuous time domain corresponds to the signal it is obtained from and may, e.g., be expressed as:

$$l[k] = \sum_{i=0}^{k} h[i]$$

It is noted that according to the present invention the establishment of the difference signal representation and the sum representation may be performed in different ways and at different times. They may, e.g., be established immediately prior to the convolution of the signals or one or both of the signals may be established anytime and anywhere prior to the convolution if that may be more convenient. In a preferred embodiment of the present invention the sum representation of the impulse response is pre-calculated and stored as constants in a table, whereas the difference signal representation derived from the input signal is established when needed.

According to the present invention, the convolution method may be hardware implemented, e.g. in an integrated circuit, in a programmable logic device (PLD) or programmable gate array (PGA), e.g. a complex programmable logic device (CPLD), an application specific integrated circuit (ASIC), a very large scale integration chip (VLSI-chip), a field programmable gate array (FPGA) etc., in a programmable processor, e.g. a digital signal processor (DSP), central processing unit (CPU), by logic gates and circuitry, as software in a computer, any combination of the above, or in any other suitable way.

When said step of establishing at least one sample of a time- and amplitude-quantized output signal OS is implemented according to the above-mentioned method of convolving in the time domain an input signal x[n] with an impulse response h[k], an advantageous embodiment of the present invention has been obtained.

When said impulse response is finite, an advantageous embodiment of the present invention has been obtained.

According to this preferred embodiment of the present invention, the length of the impulse response is finite. Furthermore, it is, preferably, of a length comparable to the length of one symbol of the input signal IS where symbol here refers to one modulated data value. I.e. when the input signal is a sampled PWM signal with, e.g., 128 samples per PWM period, a symbol is said to have a length of 128 samples and the length of the finite impulse response is, preferably, in the scale of 50-500 samples, e.g. 384 samples. The length of the impulse response may, however, according to the invention be anything, e.g. considerably longer for an advanced filter.

When the impulse response is finite the filtering may be referred to as finite impulse response filtering also referred to as FIR filtering, however by a method more sophisticated than conventionally known FIR filtering.

However, it is noted that also the use of infinite impulse responses as basis for the filtering is within the scope of the present invention. Such filtering is also referred to as infinite impulse response filtering or IIR filtering.

When said time-quantized input signal IS comprises in average at least 10, preferably at least 64, and even more preferably at least 128 samples for each input signal value change, an advantageous embodiment of the present invention has been obtained.

As described above the present invention is particularly advantageous when the input signal is an infrequently changing signal and the efficiency and benefit of the method of the present invention is substantially inversely proportional to the amount of changes in the input signal relative to the sample rate.

When said time-quantized input signal IS is a pulse width modulated signal, an advantageous embodiment of the present invention has been obtained.

When the input signal is a pulse width modulated signal, a PWM signal, the present invention is particularly advantageous as such signals are typically very infrequently changing and often sampled at rates that make conventional filtering very problematic or impossible. Even though the PWM input signal is, furthermore, preferably a two-level PWM signal, the present invention applies to signals and PWM signals of any coding scheme.

When said establishing a representation DIS of the derivative of at least a part of said time-quantized input signal IS comprises the step of establishing a sequence of differences between successive samples of said at least a part of said input signal IS, an advantageous embodiment of the present invention has been obtained.

The input signal derivative representation DIS may be established by using the formula x'[n]=x[n]-x[n-1] where x[n] denotes the input signal IS, x'[n] denotes the input signal derivative DIS, and n denotes an index to the signals. By using this formula on all samples within a part of the input signal, a corresponding difference signal is obtained for use as input signal derivative representation DIS.

When said at least a part of said time-quantized input signal IS in respect of its length corresponds to the length of said at least a part of an impulse response, an advantageous embodiment of the present invention has been obtained.

Hereby, only the part-to-be-used of the input signal IS is processed for each convolution. Thereby, processing power and storage space may be optimized for the filtering method.

When said representation DIS of the derivative of at least a part of said time-quantized input signal IS is stored in a differentiated input signal representing array DA, an advantageous embodiment of the present invention has been obtained.

When the established differentiated input signal is stored in an array, it is easy to go through or lookup values. The array DA may be implemented in any suitable way, e.g. by means of software or hardware registers, external memory of any kind, an array of variables, etc.

When said establishing a representation DIS of the derivative of at least a part of a time-quantized input signal IS comprises the step of indexing corresponding times and directions of amplitude changes of said at least a part of said input signal IS, an advantageous embodiment of the present invention has been obtained.

Indexing amplitude changes by time and direction and preferably storing these pairs in a differentiated input signal representing array DA ensures a minimum of needed storage space and, furthermore, simplifies the subsequent processing. Storing only times and directions of changes works, however, only with two-level signals. For signals with more levels, e.g. a three-level PWM signal or a 2-bit PCM signal also the magnitude of each change has to be recorded together with the times and directions, unless the signal is coded in such a way that all changes have the same magnitude.

The concept of time should be understood in a broad sense as it in the present disclosure not strictly corresponds to a measure of seconds or nanoseconds but as well may apply to a measure of a number of samples, whether these are processed in real time or not.

When the length of said at least a part of said filter representation IFC1, IFC2, IFC3 is an integer multiple of the length of a symbol of said at least a part of said time-quantized input signal IS, an advantageous embodiment of the present invention has been obtained.

According to the present invention, a symbol represents one modulated data value of the input signal. E.g. as regards PWM signals a symbol most often represents one pulse and has a length corresponding to the PWM period length.

When the limitation of the filter representation length being an integer multiple of the symbol length is applied, several implementation and processing advantages may be derived. Among these are, e.g., a simplified storage structure of time-direction pairs of changes as the times may be offset from each turnover of the signal part length as well as the possibility of reusing previously determined time-direction pairs. Array parts AP1, AP2, AP3 may facilitate such reuse.

When the number of changes within a symbol of said at least a part of said time-quantized input signal is constant, an advantageous embodiment of the present invention has been obtained.

According to this preferred embodiment of the present invention, the number of changes within an input signal symbol is fixed. Thereby, it is possible to implement more specifically dedicated change indexing logics. When the symbol edges are also synchronized with the convolution algorithm, e.g. by having the first and last input samples being used in one convolution be edges of input signal symbols an even simpler and faster change indexing means may be implemented.

When said times are indexed relative to each other, an advantageous embodiment of the present invention has been obtained.

Thereby, an alternative change determination and storage implementation may be utilized. By indexing times relative to each other is referred to indexing the time span between each change rather than an absolute time since the first sample. Again it is emphasized that a time may refer to a number of samples as well as to a span of seconds or nanoseconds.

When said establishing a representation DIS of the derivative of at least a part of a time-quantized input signal IS comprises the step of storing into a snapshot register SR said at least a part of said time-quantized input signal IS, an advantageous embodiment of the present invention has been obtained.

According to a preferred embodiment of the present invention, a part of the input signal is stored to a snapshot register RS before each convolution. Thereby, that part of the input signal may be processed while the true input signal resumes. This is particularly beneficial when only one convolution per several input samples is performed, i.e. in a situation where the filtering method is used for decimation. Thereby, the convolution means and other processing means are allowed to work at a rate corresponding to the rate of the output signal rather than of the input signal.

When said establishing a representation DIS of the derivative of at least a part of a time-quantized input signal IS comprises the step of querying said snapshot register RS regarding input signal changes, an advantageous embodiment of the present invention has been obtained.

According to the present invention the difference signal representation may be established more or less on demand by querying the snapshot register only when the convolution means are ready for the next value or values. Thereby, storage space is spared together with the otherwise most often needed pre-determination and storing of signal changes. Hence, in the present embodiment it is the query replies that represent the input signal derivative and these exist, preferably, only for a limited time and a limited part of the signal at a time.

When said at least a part of said filter representation IFC1, IFC2, IFC3 is a sum representation of at least a part of an impulse response, an advantageous embodiment of the present invention has been obtained.

According to this preferred embodiment of the present invention, the filter representation used to convolve with the input difference signal is a sum representation, i.e. the equivalent to an integrated signal representation in the continuous time domain.

Such sum representation may, e.g., be obtained according to the expression:

$$l[k] = \sum_{i=0}^{k} h[i],$$

where l[k] represents the sum representation, IFC1, IFC2 or IFC3, of the impulse response h[k].

When said at least a part of said filter representation IFC1, IFC2, IFC3 is predetermined, an advantageous embodiment of the present invention has been obtained.

According to this preferred embodiment of the present invention the filter representation, preferably the accumulated impulse response, is computed prior to the convolution processing, e.g. by the manufacturer, the user, etc. As a desired impulse response is usually not required to be changed during a convolution process its sum representation may as well be calculated once beforehand and stored in a more or less fixed way, thereby minimizing the processing needed at runtime.

When said at least a part of said filter representation IFC1, IFC2, IFC3 is implemented by means of at least one filter coefficient, more preferably at least 128 filter coefficients and even more preferably at least 384 filter coefficients, an advantageous embodiment of the present invention has been obtained.

According to this preferred embodiment of the present invention, the preferably accumulated impulse response is stored as filter coefficients. This is particularly beneficial when the sum representation is predetermined. By storing values in a table, less processing power is needed for the convolution algorithm.

Preferably, the length of the filter, i.e. the number of filter coefficients, should be short enough for the convolution to be completed within the time at disposal but still long enough for the filter to be sufficiently efficient.

When said at least a part of said filter representation IFC1, IFC2, IFC3 is implemented by means of at least one model, preferably represented by at least one polynomial, an advantageous embodiment of the present invention has been obtained.

According to this embodiment a model, preferably a mathematical model expressed by polynomials, is used for implementing the sum representation. Compared to a fixed coefficients approach as mentioned above, a model approach requires more processing power in order at runtime but requires on the other hand only little storage capacity.

When said implementation of said at least a part of said filter representation IFC1, IFC2, IFC3 is adapted to utilize any symmetry of said filter representation, an advantageous embodiment of the present invention has been obtained.

According to an embodiment of the present invention, any symmetry of the filter representation, e.g. even or odd symmetry, is utilized in order to minimize the storage space or computations needed in order to handle the filter representation.

When said at least a part of said filter representation IFC1, IFC2, IFC3 is user-adjustable, an advantageous embodiment of the present invention has been obtained.

According to this preferred embodiment of the present invention, the user may change the filter representation, e.g. according to specific uses.

When said performing filtering comprises convolving said at least a part of said filter representation IFC1, IFC2, IFC3 with said representation DIS of the derivative of at least a part of said time-quantized input signal IS, an advantageous embodiment of the present invention has been obtained.

According to a preferred embodiment of the present invention, the input signal derivative is convolved with the accumulated impulse response. Thereby, the result of a convolution of the input signal with the impulse response is obtained in a fast and efficient way.

When said performing filtering further comprises for each of said at least one sample of a time- and amplitude-quantized output signal OS adding the result of multiplying an initial value IV of said at least a part of said time-quantized input signal IS with a value of said at least a part of said filter representation IFC1, IFC2, IFC3, an advantageous embodiment of the present invention has been obtained.

According to this embodiment of the present invention, an initial value IV of the current processed part of the input signal IS should be multiplied with the last value of the accumulated impulse response IFC1, IFC2, IFC3 and the result hereof added to the result of the convolution.

When said performing filtering further comprises adding, for each of said at least one sample of a time- and amplitude-quantized output signal OS, an initial value IV of said at least a part of said time-quantized input signal IS, an advantageous embodiment of the present invention has been obtained.

According to this preferred embodiment of the present invention, the initial input signal value IV is merely added to the output sample. This is possible in the preferred embodiment where the desired filter has unity DC-gain and thus the last value of the accumulated impulse response is 1.

When said performing filtering comprises exercising the expression $$y[n] = \sum_{k=0}^{N-2} (l[k] \cdot x'[n-k]) + l[N-1] \cdot x[n-(N-1)],$$

where y[n] represents said at least one sample of a time- and amplitude-quantized output signal OS, x[n] represents said at least a part of said time-quantized input signal IS, x'[n] represents said representation DIS of the derivative of x[n], l[k] represents said at least a part of said filter representation IFC1, IFC2, IFC3, and N represents the length of l[k], an advantageous embodiment of the present invention has been obtained.

When said performing filtering further comprises performing conventional filtering, an advantageous embodiment of the present invention has been obtained.

According to this preferred embodiment of the present invention, the result of the fast filtering method of the present invention is, furthermore, filtered by conventional filtering methods. This may be particularly beneficial when the desired overall filter characteristic is possible to divide into a part that may take advantage of the fast filtering method of the present invention and a part that may as well or even better be performed by conventional filtering methods. Alternatively, when the fast filtering method of the present invention is also used for decimation of the sample rate, conventional filtering may subsequently be performed on the lower rated output.

The conventional filtering may alternatively comprise integration or any other kind of filtering.

When the sample rate of said time- and amplitude-quantized output signal OS is different from the sample rate of said time-quantized input signal IS, an advantageous embodiment of the present invention has been obtained.

According to this preferred embodiment of the present invention, the output signal is differently rated than the input signal. Thereby, the fast filtering method of the present invention may also serve as, e.g., a decimation method. By facilitating rate conversion the method of the present invention allows the output signal to be adapted to a specific requirement of subsequent processing steps.

When the sample rate of said time- and amplitude-quantized output signal OS corresponds to the symbol rate of said time-quantized input signal IS, an advantageous embodiment of the present invention has been obtained.

According to this preferred embodiment of the present invention, the input signal is filtered and decimated in order for the output signal to comprise only one sample for each input signal symbol. This embodiment is particular advantageous when the fast filtering method of the present invention is used for demodulating a signal requiring a high time resolution, e.g. a PWM-signal, the PWM-pulses, thus, denoting the input signal symbols. The output signal is then, typically, of more convenient use when having the sample rate of the input symbols, e.g. the PWM-pulses.

When said convolving said at least a part of said filter representation IFC1, IFC2, IFC3 with said representation DIS of the derivative of at least a part of said time-quantized input signal IS is performed for only some of the samples of said time-quantized input signal IS, preferably for only every $128^{th}$ sample, an advantageous embodiment of the present invention has been obtained.

According to this preferred embodiment of the present invention, the convolution process is not performed for every input sample. Thereby, less output samples are established than input samples available, and the output signal is, thus, decimated. The decimation factor corresponds to the amount of convolutions relative to the number of input samples. If, e.g., only one convolution is made for every 128 samples, the sample rate of the output signal established is only $\frac{1}{128}$ of the input signal's sample rate. If, with the same example, each input signal symbol, e.g. PWM pulses, has a length of 128 input samples, the output signal's sample rate will correspond to the input signal's symbol rate, which is typically also preferred.

When said filter representation IFC1, IFC2, IFC3 comprises a sum representation of a low-pass filter, an advantageous embodiment of the present invention has been obtained.

According to this preferred embodiment of the present invention, the input signal is low-pass filtered. This is very advantageous when the method is used for decimation, as the input signal then need to be low-pass filtered in order to avoid aliasing. Low-pass filtering also often causes an infrequently changing modulated signal, e.g. a PWM-signal, to be demodulated.

When said method is exercised in real time, an advantageous embodiment of the present invention has been obtained.

According to this preferred embodiment of the present invention, the method is a real time method and may, thus, be used to filter signals in real time. Hence, an advantageous method for use in, e.g., real time audio applications or other real time applications is provided. According to the present invention real time is interpreted in a broad sense, thus also covering more realistic applications where the filtering is in fact performed at a rate keeping up with the input signal but where the processing, however, constitutes a small or longer delay.

When said at least a part of a filter representation IFC1, IFC2, IFC3 represents at least a part of an impulse response, an advantageous embodiment of the present invention has been obtained.

According to this embodiment of the present invention, the filter representation on the basis of which the derivative of the input signal is filtered, is the impulse response of a desired filter characteristic and thereby not an accumulated impulse response. When such a filter representation is used for the filtering, the output signal should, preferably, be integrated in order to provide the desired result.

When said at least a part of a filter representation IFC1, IFC2, IFC3 represents the derivative of at least a part of an impulse response, an advantageous embodiment of the present invention has been obtained.

According to this embodiment of the present invention, the filter representation on the basis of which the derivative of the input signal is filtered is the derivative of the impulse response of a desired filter characteristic and is, thereby, not an accumulated impulse response. When such a filter representation is used for the filtering, the output signal should, preferably, be integrated twice in order to provide the desired result.

When the hardware implemented filtering method mentioned above further comprises the step of integrating at least once said time- and amplitude-quantized output signal OS, an advantageous embodiment of the present invention has been obtained.

According to this embodiment of the present invention, the output signal is integrated either in the discrete-time domain or, subsequent to any digital-to-analogue conversion, in the continuous-time domain. This integration is beneficial when the filter representation is not an integrated impulse response of a filter. The integration may need to be performed twice or more according to the amount of differentiation and integration previously performed on the input signal and filter representation. The integration may be performed by any integration means, e.g. digitally or analogue, and by any variant of integration, e.g. also by so-called leaky integration.

The present invention further relates to a decimation method for decimating a time-quantized input signal IS comprising the steps of dividing said time-quantized input signal IS into intervals, for each of said intervals establishing a sample of a time- and amplitude-quantized output signal OS according to the hardware implemented filtering method or hardware implemented method of convolving an input signal with an impulse response mentioned above.

According to this preferred embodiment of the present invention, a decimation method comprising filtering, e.g. anti-alias filtering and usable on signals with high sample rates, is provided. The decimation method of the present invention is particularly advantageous when used on infrequently changing input signals.

Some degree of anti-aliasing has to be applied to properly decimate the input signal and this may advantageously be done by means of the filtering method of the present invention.

In order for the output signal to be decimated relative to the input signal, the method of the present invention should not necessarily be carried out continuously with the input signal but rather at certain intervals. These intervals should, preferably, be of equal length but may in certain applications be irregular. By applying the method of the present invention for every sample of a sampled input signal, the resulting decimation factor is 1, i.e. the output signal is of the same rate as the input signal. By only applying the method for every second, $10^{th}$ or $128^{th}$ sample of a sampled input signal, the resulting decimation factors are correspondingly 2, 10 and 128, i.e. the sample rate of the output signal is a half, a $\frac{1}{10}$ or a $\frac{1}{128}$ of the input sample rate.

The decimation method of the present invention is particularly advantageously used within applications where a sub-circuit needs a signal to have a very high sample rate. In order for the output to be used in other parts of the application, it needs to be decimated. This may, e.g., occur where an analogue signal comprising time-sensitive modulated information is sampled by means of a fast A/D-converter in order to process the signal by digital means. When the signal is processed it may be decimated and possibly also demodulated before sent to the next stage.

The present invention further relates to a fast filtering means FFM comprising differentiation means DM for establishing a representation DIS of the derivative of at least a part of a time-quantized input signal IS, and filtering means FM for establishing at least one sample of an output signal OS by performing filtering on the basis of at least a part of a filter representation IFC1, IFC2, IFC3 and said representation DIS of the derivative of at least a part of said input signal IS.

According to the present invention an advantageous filtering means is provided for performing fast filtering, preferably fast FIR filtering, of time-quantized input signals, preferably infrequently changing signals, e.g. PWM-signals.

When the fast filtering means FFM implements the hardware implemented filtering method or hardware implemented method of convolving an input signal with an impulse response or the hardware implemented decimation method mentioned above, an advantageous embodiment of the present invention has been obtained.

THE DRAWINGS

Figure 2:
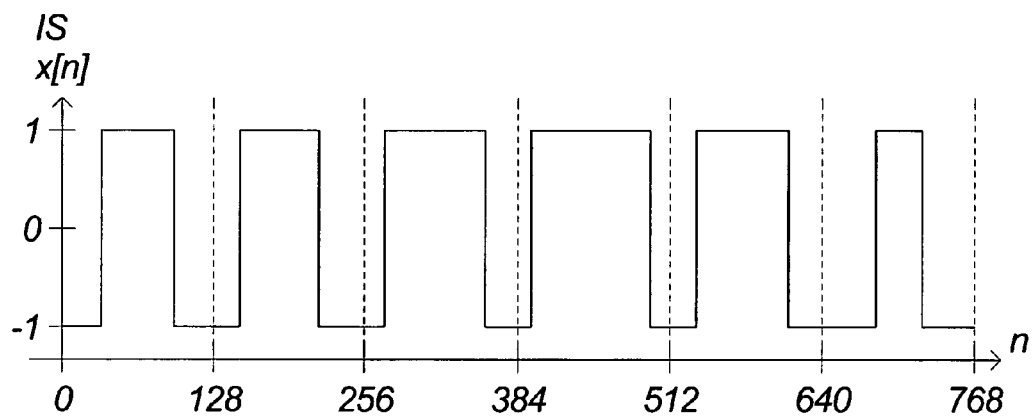
Figure 3:
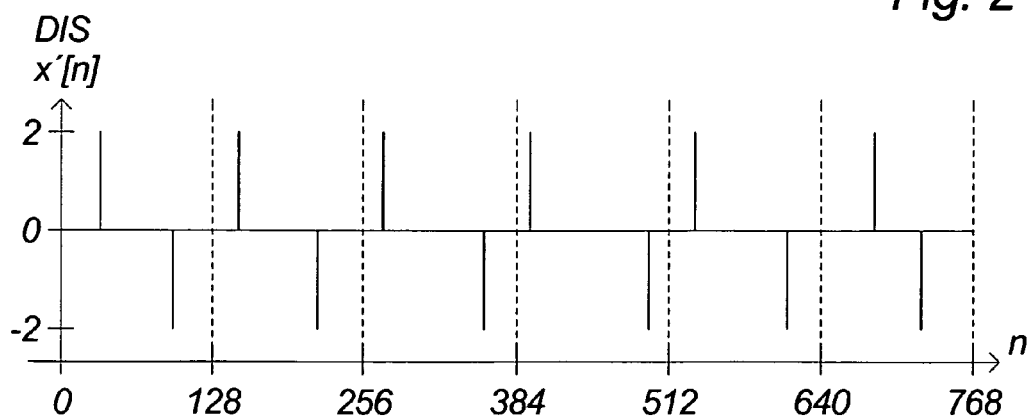
Figure 4:
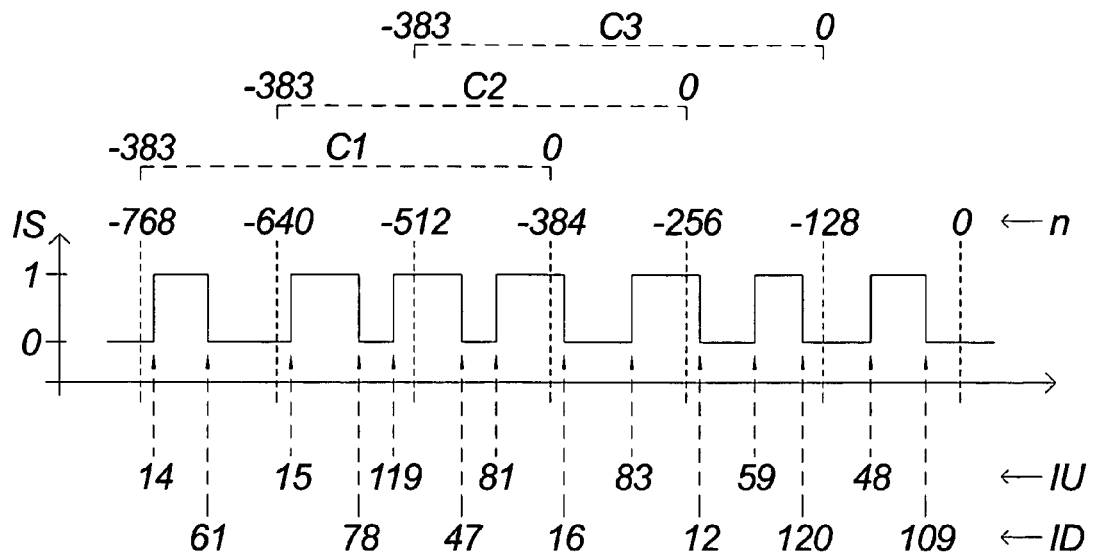
Figure 5:
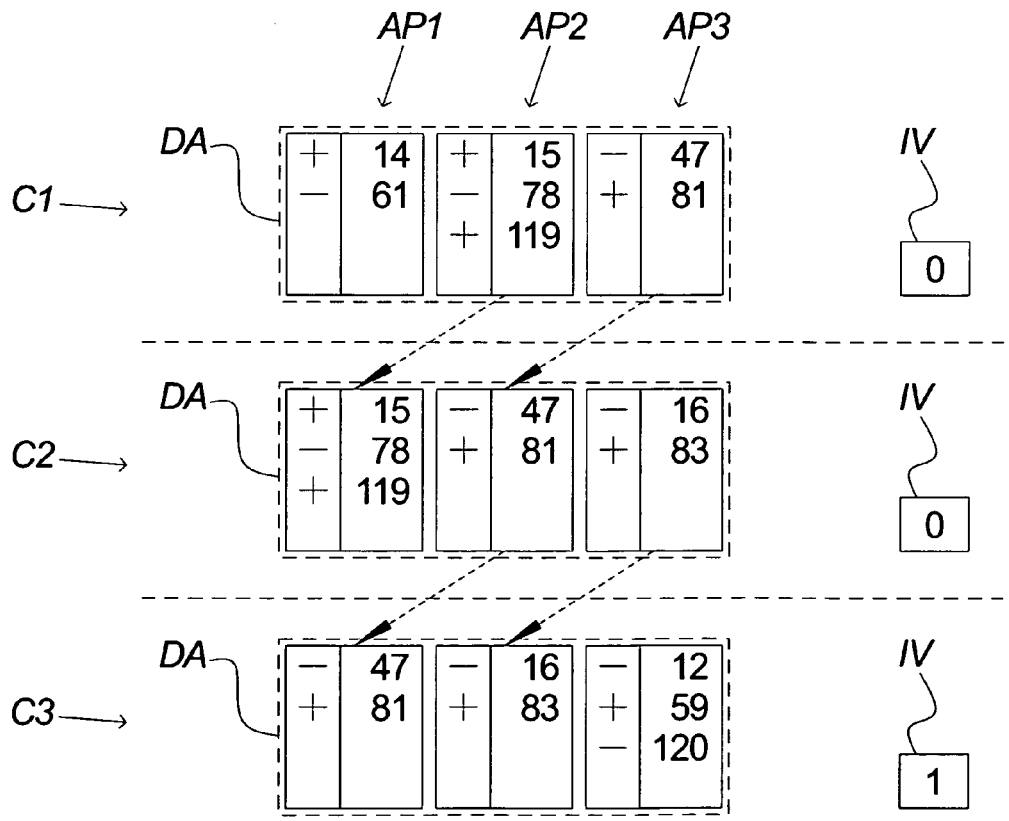
Figure 6:
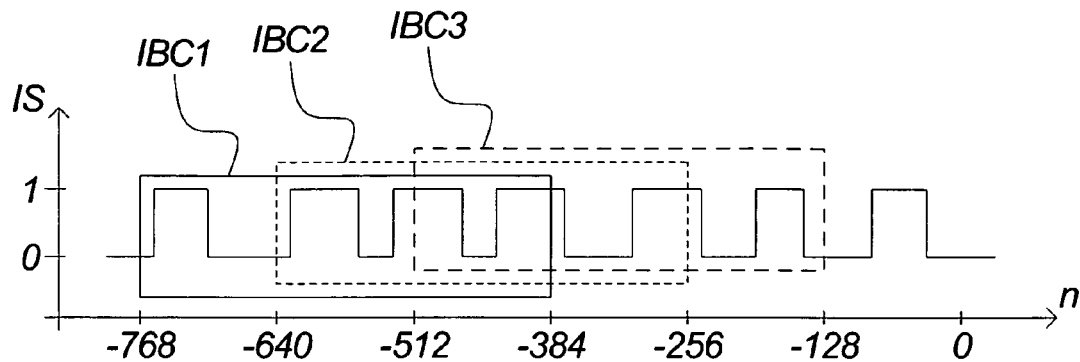
Figure 7:
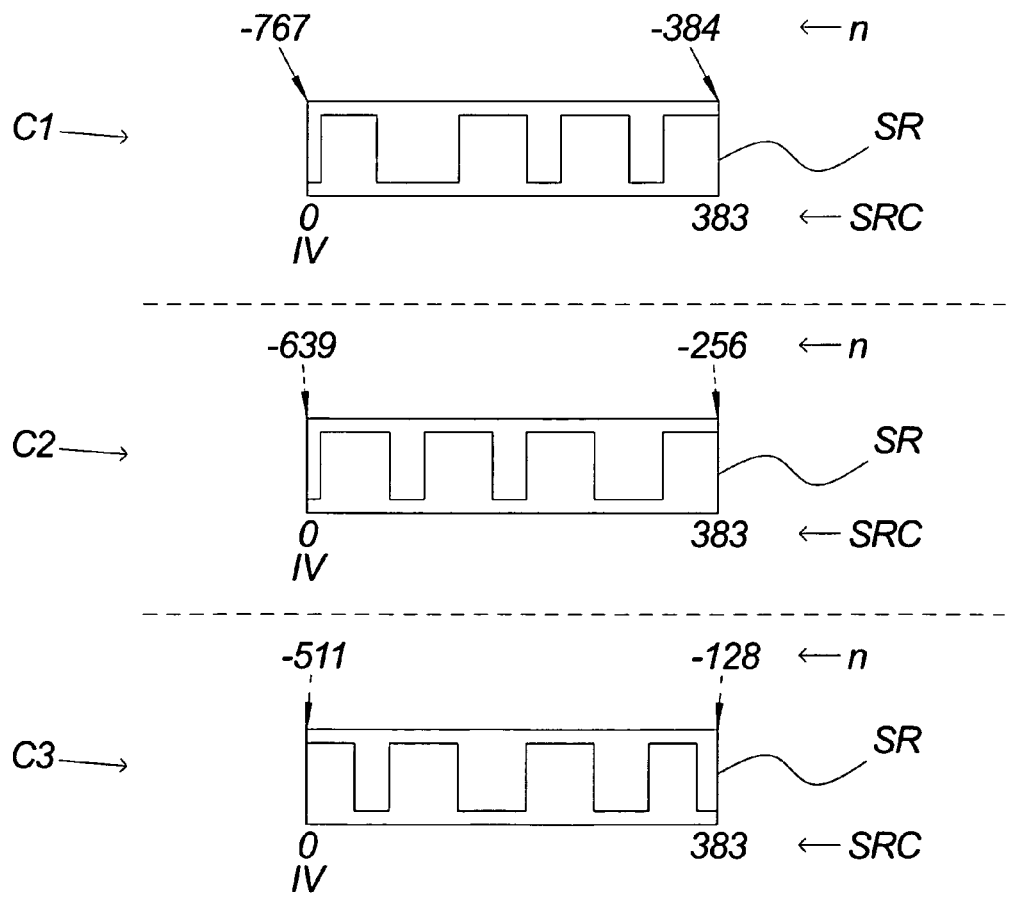
Figure 8:
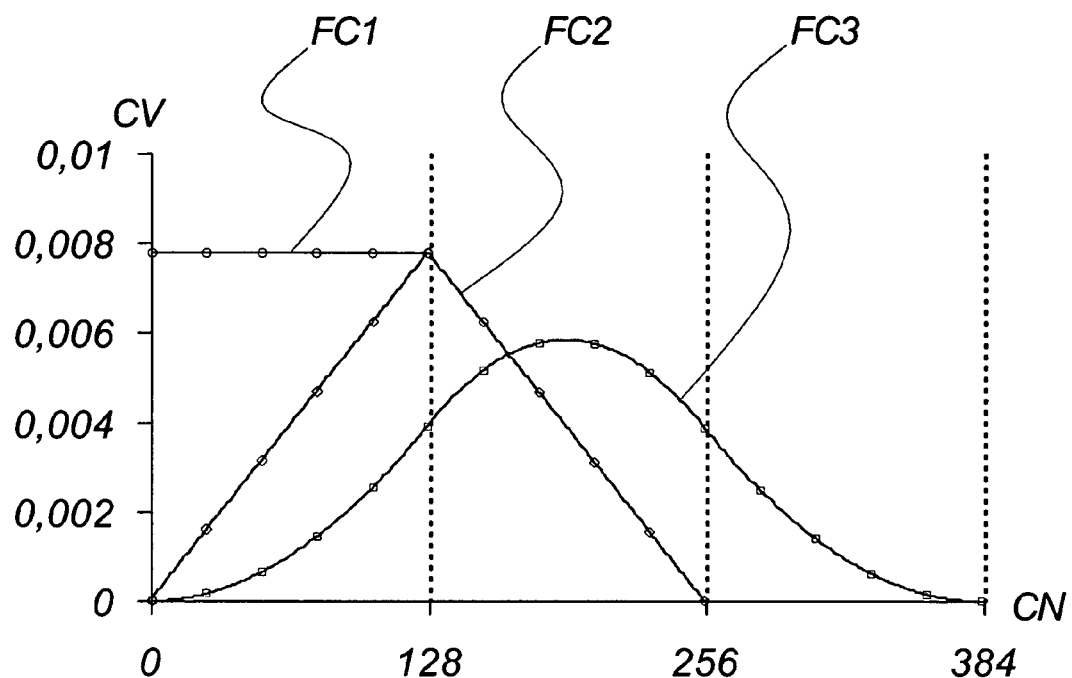
Figure 9:
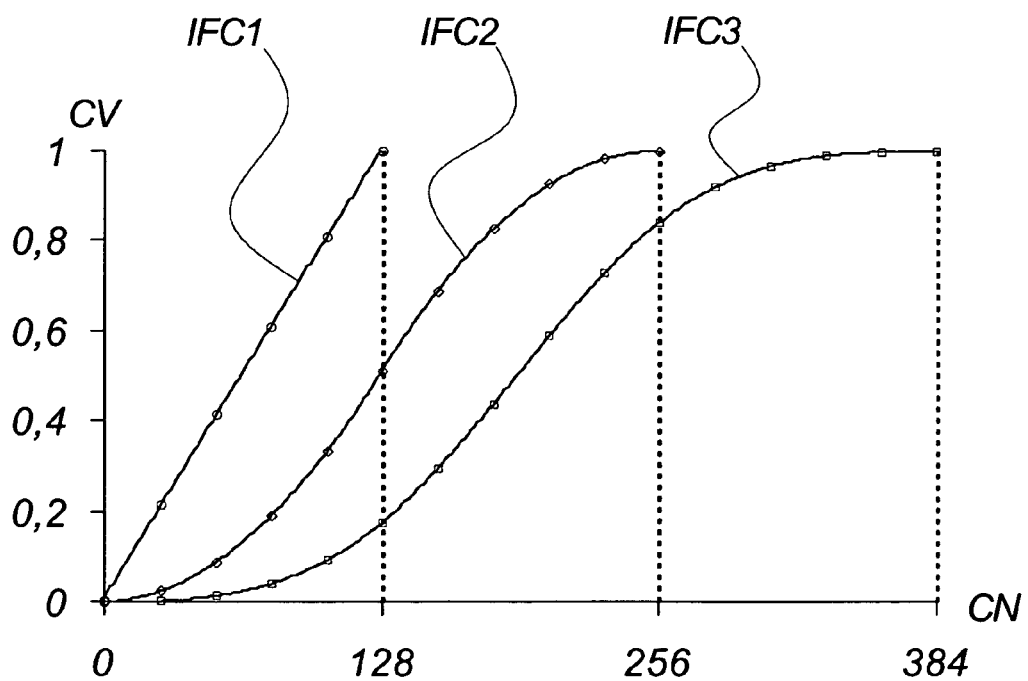
Figure 10:
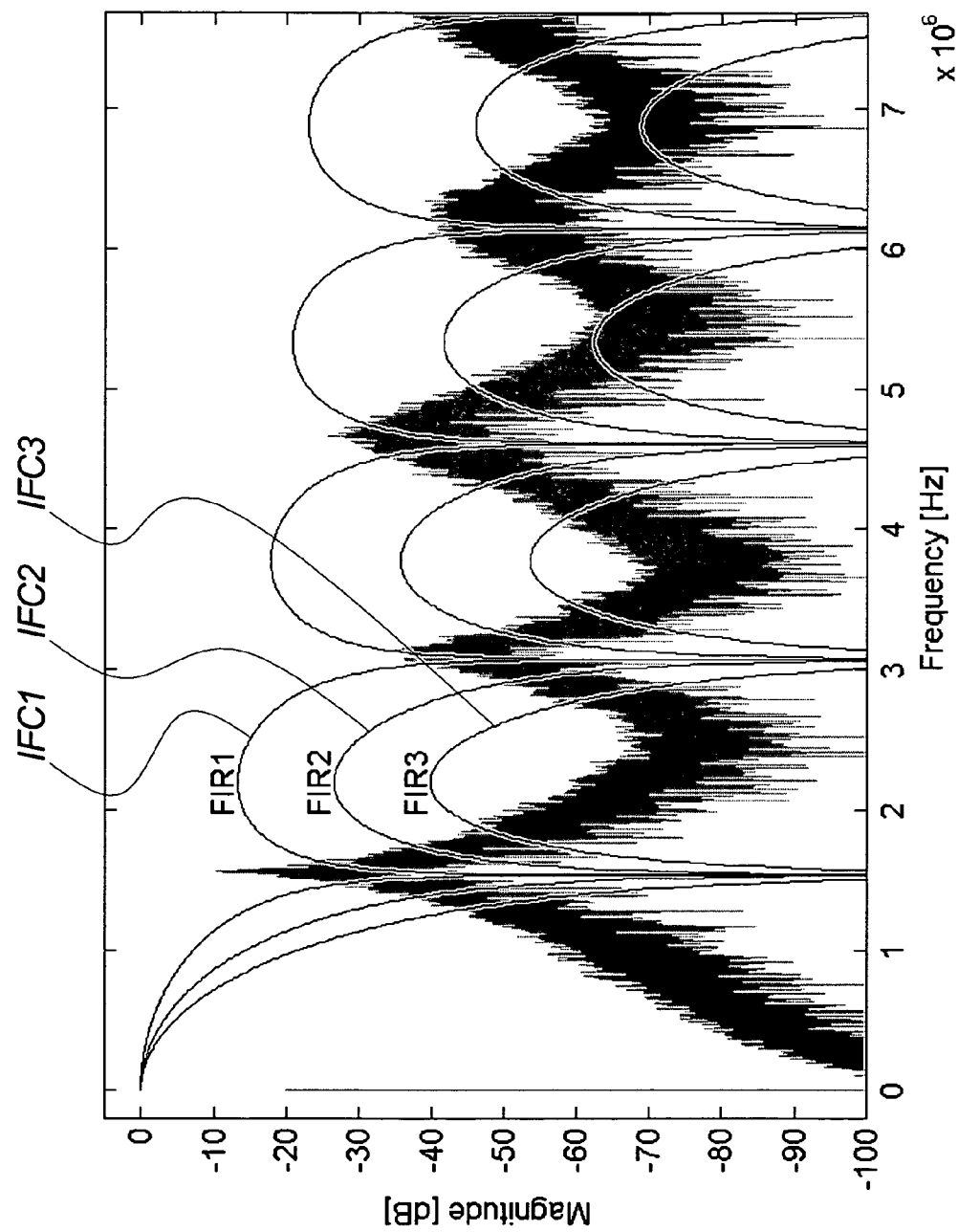
Figure 11:
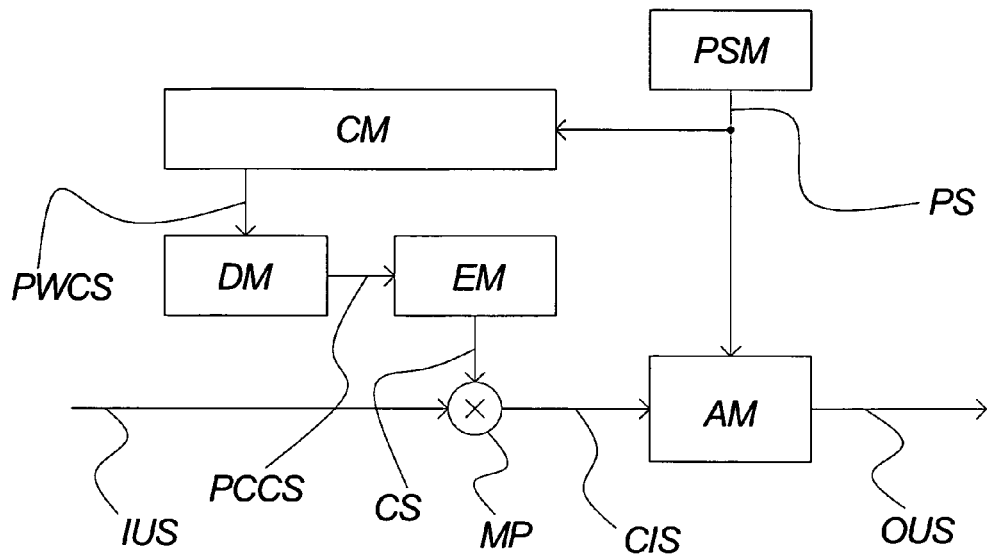
Figure 12:
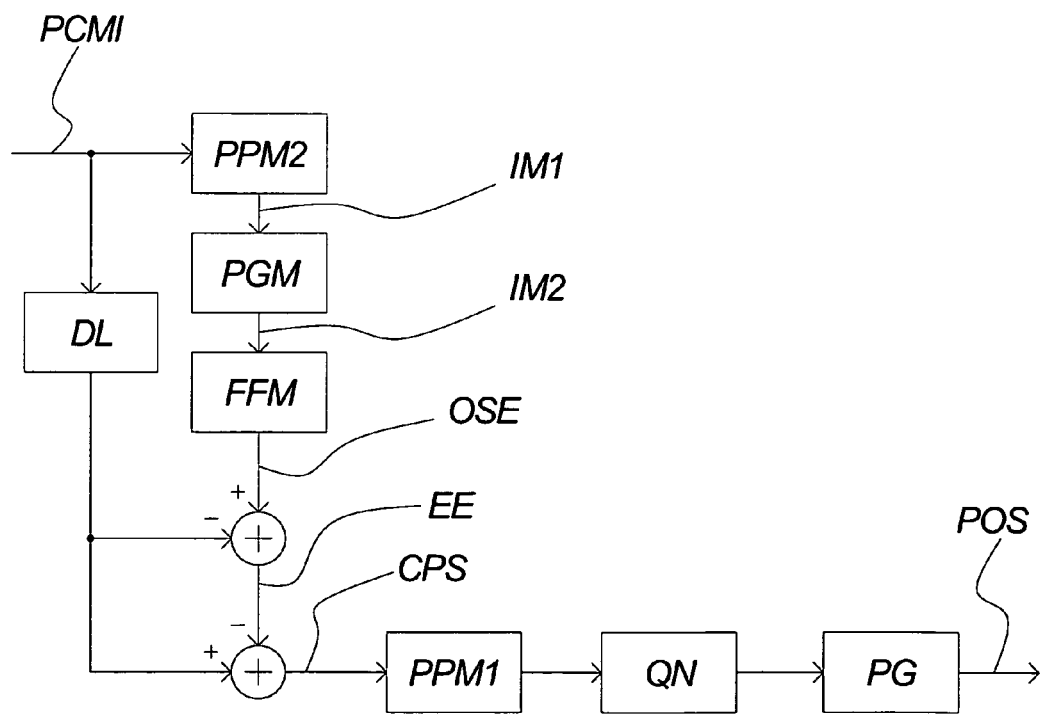

In the following, the invention will be described with reference to the drawings where FIG. 1 illustrates a conceptual block diagram of the present invention, FIG. 2 illustrates an example of an infrequently changing input signal, FIG. 3 illustrates a difference signal derived from the signal of FIG. 2, FIG. 4 illustrates one method of establishing a differentiated input signal DIS, FIG. 5 illustrates examples of a differentiated input signal representing array DA, FIG. 6 illustrates an alternative method of establishing a differentiated input signal, FIG. 7 illustrates examples of a snapshot register SR, FIG. 8 illustrates examples of filter coefficients, FIG. 9 illustrates examples of integrated filter coefficients, FIG. 10 illustrates the efficiency of a preferred filter characteristic, FIG. 11 illustrates an application where the present invention may be used, and FIG. 12 illustrates a further application where the present invention may be used.

DETAILED DESCRIPTION

Several types of sampled signals with fast sample rates have relatively infrequently changing content. An example of such a signal is illustrated graphically in FIG. 2, which comprises a vertical axis for indicating the value of an input signal x[n] and a horizontal axis for indicating samples n of the input signal. The signal x[n] of this example comprises a pulse width modulated signal (also referred to as a PWM signal) having a period length of 128 samples as indicated by the dashed vertical lines. The PWM signal is characterized by only changing its value twice per period and as its information is represented by the times where the signal changes, a high sample rate is necessary in order to convey high resolution information. The sampled PWM signal may, thus, be considered having content that is infrequently changing relative to the sample rate, i.e. twice per, e.g., 128 samples.

Examples of sampled signals with relatively infrequently changing content may comprise signals modulated by different varieties of the PWM technique, e.g. uniform PWM (UPWM), natural PWM (NPWM) and linearized PWM (LPWM), two- and three-level single sided (UADS and UBDS) and two- and three-level double sided (UADD and UBDD) PWM modulation schemes, pulse density modulated signals (also referred to as PDM signals) of different kinds, pulse position modulated signals (also referred to as PPM signals) of different kinds, over-sampled signals of different kinds, etc. The signals may have any bit-width, e.g. 1 bit for a most simple PWM or PDM signal, 2 bit for a three- or four-level PWM signal, etc.

The present invention provides a method for performing filtering, preferably finite impulse response filtering (also referred to as FIR filtering), which is especially advantageous when processing signals having content that is infrequently changing relative to the sample rate.

The fast filtering method of a preferred embodiment of the present invention utilizes that the difference signal of an infrequently changing signal becomes zero except for the few times where the original signal changes. An example of such a difference signal x'[n] of an infrequently changing signal is illustrated in FIG. 3. It illustrates a difference signal derived from the PWM signal of FIG. 2 on the basis of the expression:

$$x'[n] = x[n] - x[n-1]$$

FIG. 3 illustrates the same axes as in FIG. 2, except for the change of density of the vertical axis. Where the example PWM signal in FIG. 2 changes from −1 to 1, the difference signal of FIG. 3 assumes the value 2, i.e. 1−(−1), and where the PWM signal changes from 1 to −1 the difference signal assumes the value −2, i.e. (−1)−1. As the PWM signal is constant everywhere else, the difference signal takes the value zero for most of the samples.

As described above, conventional FIR-filtering is usually performed by convolving a finite number of impulse response coefficients h[k] of a desired FIR-filter with an equivalent number of samples from the input signal x[n] in order to establish one sample of the output signal y[n]:

$$y[n] = h[k] * x[n] = \sum_{k=0}^{N-1} (h[k] \cdot x[n-k]),$$

where N is the length of the impulse response h[k].

Thus, in order to establish one output sample the registers of some processing means must be loaded N times with N possibly different values and N multiplications and N−1 additions usually have to be made. If the values, i.e. the signal values, the impulse response coefficients or both, are high resolution values the multiplications and/or additions may, depending on the particular hard- and software capabilities, have to be carried out, e.g. twice for each value for the most significant half and the least significant half, respectively.

Turning back to the example difference signal x'[n] of FIG. 3, it is easy to see that if such a signal is used as input signal for a convolution process as the above-described, most of the multiplications may be omitted in advance as they result in the value of zero regardless of what filter coefficient they are multiplied with. Consequently, most of the additions may also be omitted as a zero addend leaves the result unchanged. In order to utilize such features of the input signal, some additional control logic and processing steps are needed. However, at least when the difference signal is derived from an infrequently changing signal, the extra processing may most often easily be performed within the time saved by the fewer calculations.

In addition to the extra control logic needed, also the finite impulse response coefficients have to be adapted in order to obtain the same resulting output signal as with conventional convolution techniques. Generally, it may be stated that the filter coefficients to convolve with the difference signal x'[n] should ensure that the resulting signal is equal to the signal y[n] established by convolving the original filter coefficients h[k] with the original input signal x[n]. It can be shown that establishing a sum signal l[k] on the basis of the original filter coefficients h[k] may almost match that criterion, with only an initial value missing. Thus, as shown below, convolving a difference signal x'[n] with the accumulated filter coefficients l[k] and thereto adding an initial value, i.e. the oldest value of the original signal x[n−(N−1)] produces a signal y[n] being equal to what would be the output of conventionally convolving a signal x[n] with a set of filter coefficients h[k]. This may be justified by the following reasoning:

The general expression for the FIR filter's output derived in terms of the impulse response may be written as:

EQ1:

$$y[n] = \sum_{k=0}^{N-1} (h[k] \cdot x[n-k])$$
$$= h[0] \cdot x[n] + h[1] \cdot x[n-1] + h[2] \cdot x[n-2] + \ldots +$$
$$h[N-2] \cdot x[n-(N-2)] + h[N-1] \cdot x[n-(N-1)]$$

where x is a time-quantized input signal, h is a time-quantized filter impulse response of length N, and y is a time-quantized output signal.

Implementing this expression as a convolution algorithm is very straightforward but not very efficient for long FIR filter impulse responses or high frequency real-time signals as one addition and one multiplication is required for each filter coefficient, i.e. N−1 additions.

In this case of time-quantized signals, the derivative x' of the input signal x may be represented by a difference signal written as:

$$x'[n] = x[n] - x[n-1]$$

Accordingly, the integral l of the FIR filter impulse response h may in the discrete time domain be written as a sum:

$$l[k] = \sum_{i=0}^{k} h[i]$$

Convolving the difference signal x'[n] with the first N−1 samples, i.e. all except the last, of the sum l[k] of the N-length FIR filter impulse response produces:

$$w[n] = \sum_{k=0}^{N-2}(l[k] \cdot x'[n-k])$$

$$= \sum_{k=0}^{N-2}\left(\left(\sum_{i=0}^{k}h[i]\right) \cdot (x[n-k]-x[n-1-k])\right)$$

$$= (x[n]-x[n-1]) \cdot h[0] + (x[n-1]-x[n-2]) \cdot$$
$$(h[0]+h[1]) + (x[n-2]-x[n-3]) \cdot$$
$$(h[0]+h[1]+h[2]) + \ldots + \binom{x[n-(N-2)]-}{x[n-(N-1)]} \cdot \left(\sum_{k=0}^{N-2}h[k]\right)$$

Rearranging the above produces:

$$w[n] = x[n] \cdot h[0] + x[n-1] \cdot (-h[0]+h[0]+h[1]) +$$
$$x[n-2] \cdot (-h[0]-h[1]+h[0]+h[1]+h[2]) +$$
$$x[n-3] \cdot (-h[0]-h[1]-h[2]+h[0]+h[1]+h[2]+h[3]) + \ldots +$$
$$x[n-(N-2)] \cdot \left(\left(-\sum_{k=0}^{N-3}h[k]\right)+\left(\sum_{k=0}^{N-2}h[k]\right)\right) + x[n-(N-1)] \cdot \left(-\sum_{k=0}^{N-2}h[k]\right)$$

Which may be reduced to:

EQ2:

$$w[n] = h[0] \cdot x[n] + h[1] \cdot x[n-1] + h[2] \cdot x[n-2] + h[3] \cdot x[n-3] + \ldots +$$
$$h[N-2] \cdot x[n-(N-2)] + \left(-\sum_{k=0}^{N-2}h[k]\right) \cdot x[n-(N-1)]$$

Except for the last product of the expressions for w[n] (EQ2) and y[n] (EQ1), the equations are equal. Thus, y[n] may be expressed as:

EQ 3:

$$y[n] = w[n] + \underbrace{\left(\sum_{k=0}^{N-2}h[k]\right) \cdot x[n-(N-1)]}_{\text{negated last product of } w[n]} + \underbrace{h[N-1] \cdot x[n-(N-1)]}_{\text{last product of } y[n]}$$

$$= w[n] + x[n-(N-1)] \cdot \left(h[N-1] + \sum_{k=0}^{N-2}h[k]\right)$$

$$= w[n] + x[n-(N-1)] \cdot \left(\sum_{k=0}^{N-1}h[k]\right)$$

From the above is seen that y[n] may be obtained by convolving the difference signal of the input signal with the sum of the first N−1 samples of the N-length FIR filter impulse response and thereto adding the product of multiplying the accumulated all N samples of the impulse response with a further sample of the original input signal x[n].

In preferred embodiments of the invention, the DC-gain of the FIR filter is unity. This is achieved by scaling the impulse response coefficients of the FIR filter so that their overall sum equals 1. Thus, for embodiments providing a filter with unity DC-gain filtering it applies that:

$$\left(\sum_{k=0}^{N-1}h[k]\right) = 1$$

and thereby the expression for y[n] may be reduced to:

$$y[n] = w[n] + x[n-(N-1)]$$
$$= w[n] + x[n-N+1]$$

In the above expression x[n−(N−1)] is the oldest sample of the processed part of the original signal.

As x'[n] and l[n] may be determined before the FIR filtering, it is known which samples of x'[n] that are zero. This knowledge may be used for only calculating the products of the convolution where x'[n]≠0. For slow-varying signals only few samples of x'[n] are non-zero and thus the number of multiplications and additions to carry out is significantly reduced.

FIG. 1 illustrates conceptually an embodiment of the present invention. It comprises an input signal IS coupled to a differentiation means DM. From the differentiation means DM is output two signals, a difference input signal DIS and an initial value signal IV. Both signals are coupled to a filtering means FM, which establishes an output signal OS.

The input signal IS may be any kind of sampled signal but is preferably a sampled signal with infrequently changing content, e.g. a PWM signal such as the signal x[n] illustrated in FIG. 2.

The differentiation means DM is a means adapted for deriving from the input signal IS a difference input signal DIS such as the signal x'[n] illustrated in FIG. 3. The differentiation means DM further establishes an initial value signal IV, representing the first sample of the part of the input signal IS currently being processed. As shown during the above reasoning, this value referred to as x[n−(N−1)] is necessary in order to establish a final result equal to the conventional and heavy convolution of the immediate input signal.

The filtering means FM is adapted to perform convolution of the difference input signal DIS, also referred to as x'[n], with a set of filter coefficients, in the above reasoning referred to as l[k]. The output signal OS is established on the basis of the result of the convolution and the initial value IV. The output signal is, preferably, a pulse code modulated signal, i.e. a PCM signal.

An advanced preferred embodiment of the present invention further facilitates the rate of the output signal OS to be different, preferably to the lower, from the rate of the input signal IS. This is an advantageous feature, as the output signal may then be adapted to match any subsequent processing means or be suited for comparison with a certain other signal. Especially in applications where sampled signals are processed, the signal rates are often increased in order to facilitate broadband processing but should subsequently be reduced in order to minimize unnecessary overhead in order to match the subsequent steps or certain standards, or in order to facilitate transmission by standard transmission means or over long distances.

The filtering means FM may, further, comprise additional filtering means, e.g. conventional filters to be applied subsequently to the convolution described above. In a preferred embodiment of the present invention, comprising such additional filtering means, the above-described sophisticated filtering and decimation method is used for filtering and decimating the rate of the input signal only from, e.g., 512 times the desired rate to, e.g., 4 times the desired rate, whereupon the rate may be slow enough to enable conventional, possibly more advanced, filters, before decimating the last, e.g., 4 times.

In a further embodiment of the present invention, the filtering means FM may further comprise means for integrating the output of the convolution. This may be particularly useful when the filter coefficients or filter model are/is not an integrated representation of the desired filter. The integration may comprise any integration means, e.g. digital or analogue, true integrators or leaky integrators, etc.

The present invention may be implemented in several different ways. Some possible implementations follow very well the conceptual diagram of FIG. 1, whereas others appear as a more integrated whole.

In an embodiment of the present invention, the differentiation means DM is adapted to index the time and direction of any changes in the input signal IS. From a dynamic array comprising such times and directions established by the differentiation means; it would be possible to establish the differentiated or difference signal and such an array may, thus, be regarded as a representation of the difference input signal DIS.

To help illustrate the indexing process and a possible difference input signal representing array DA, an example is given below with reference to FIGS. 4 and 5. The example is based on a two-level PWM input signal IS capable of representing the values 0 and 1 and a filter having an impulse response of length 384. The horizontal axis represents the sample count n, divided into blocks of 128 samples. For time-related signals, e.g. audio or video, the sample count axis also represents the time. The samples are divided this way due to a desired rate decimation of 128 times in this example. Calculating only one output sample for each 128 input samples is an advantageous way of obtaining the decimation and thus a division of the input signal into blocks of 128 is meaningful but, however, not necessary. As regards the sample count n the value 0 at all times represents the newest sample and thus negative counts represents older samples. Thus, the sample with the number −767 is the oldest sample illustrated in FIG. 4.

Under the horizontal axis, indexes representing upward input signal changes IU and downward input signal changes ID are shown. The indexes are offsets according to the block of 128 samples they belong to. When, e.g., a downward change within the block starting with sample number −383 is indexed with the value 16 this actually means that a downward change has occurred from sample −368 to sample −367, as −383+16=−367. The logic that actually detects the changes and records the time or count where they occur may be any suitable hardware or software implementation. To a person skilled in the art several well-known solutions to this step exist. One possible embodiment of such a change indexer may read the input signal into a so-called first-in-first-out (FIFO) buffer sized for two samples. In the case of a two-level PWM signal such a buffer requires two bits. When the third sample arrives it is read into the buffer causing the second sample to be shifted to the place of the first sample, thus discarding the first sample. A counter keeps track of the number of received samples. In the above example, the counter may reset or turn over each 128 samples, thus being at least a 7-bit counter. By means of simple logical gates or arithmetic the two samples stored in the buffer are compared each time a new samples arrives and if the samples are different, a record of the direction and current counter value is stored in the differentiated input signal representing array DA.

In the present example embodiment a FIR filtering of length 384 samples is wanted. The difference input signal representation DIS should, thus, at least be able to provide information about 384 samples. This may be obtained in several ways. In the present example an array comprising the indexes of the upward and downward changes may be established. An example of such an array DA is illustrated in FIG. 5 at three different time stages, C1, C2 and C3, each corresponding an output sample computation. As 384 samples cover exactly 3 blocks of 128 samples, it comprises three array parts, AP1, AP2, and AP3. At the time of the first computation C1 the first array part AP1, thus, corresponds to the first 128 samples of the signal illustrated in FIG. 4, i.e. samples −767 through −640, the second array part AP2 corresponds to the next 128 samples, i.e. samples −639 through −512, and the third array part AP3 corresponds to the next 128 samples, i.e. samples −511 through −384. It is no requirement to the filter length that it covers an integer value of blocks as in example. The filter length and the decimation factor may be chosen completely independently but in a practical implementation a few advantages may be derived from choosing the filter length to be an integer multiple of the decimation factor.

For each signal level change of the input signal IS, two values are recorded by the differentiation means DM. A first column of the difference input signal representing array DA holds directional information of the change where a "+" represents an upward change and a "−" represents a downward change. A second column holds timing information of the change, i.e. the index offsets IU and ID. In order to find the absolute indexes relative to the current computation frame C1, C2, C3, of the changes, the indexes of the first array part AP1 should be added to an offset of −383, the indexes of the second array part AP2 should be added to an offset of −255, and the indexes of the third array part AP3 should be added to an offset of −127. In order to use the indexes for filter coefficient look-up, the indexes of the first array part AP1 should be subtracted from and offset of 383, the indexes of the second array part AP2 from an offset of 255, and the indexes of the third array part AP3 from an offset of 127 as the filter coefficients have indexes in the range 0 to 383.

The difference input signal representing array DA is in FIG. 5 illustrated at three different times. As an output sample should be calculated for every 128 input samples due to the decimation factor, the array is illustrated as it would look with the input signal of FIG. 4 at each of the first three output sample computations C1, C2 and C3. As it holds information about 384 samples but only need 128 new samples before each computation, the indexes stored in the second and third array parts AP2, AP3 may be left unchanged when initializing the next output sample computation and just moved to the preceding array part, i.e. AP1 and AP2. This is illustrated by use of arrows in FIG. 5. In a practical implementation the indexes may as well be left unmoved, and pointers to the array parts rather be modified from pointing to AP2 and AP3 into pointing to AP1 and AP2.

In an alternative embodiment relative indexes may be stored, i.e. the number of samples between each change. With that embodiment at the time C1 the first array part AP1 of FIG. 5 would comprise the values 14 (from 14−0) and 47 (from 61−14), the second array part the values 82 (from 128+15−61), 63 (from 78−15) and 41, and the third array part the values 56 and 34.

The difference input signal representing array DA may be implemented in any suitable way. In the present example where the maximum index is 127 it would be beneficial to store each index as a 1-byte signed integer, thus letting the sign represent the change direction, or alternatively as a 7-bit unsigned integer, reserving a separate bit for indicating the direction.

With the above-described embodiments it is implied that the input signal IS is a two-level signal, thus causing all changes to have a magnitude of 1 level which in the above example is 1, i.e. 1−0=1. When an input signal with three or more levels is used, e.g. a three-level PWM signal, the differentiated input signal representation needs to be capable of storing information about the magnitude of each change. With a three-level signal, providing, e.g., the levels −1, 0 and 1, change magnitudes of 0, 1 and 2 levels may occur. As it should be possible to establish the true difference signal from the differentiated input signal representation, the magnitudes of the changes have to be tracked as well as the direction and sample count. The change magnitude may, e.g., be stored together with the direction information as a signed integer. If the input samples are compared by subtraction, both the direction and the magnitude are automatically comprised by the result.

In addition to establishing the difference input signal representing array DA, which corresponds to the difference input signal DIS of FIG. 1, the differentiation means DM should also establish an initial value signal IV. The initial value should be the value of the oldest of the 384 samples of the input signal IS which difference signal is currently represented by the array DA, i.e. the sample with the absolute index of −383. The content of the initial value signal IV is illustrated in FIG. 5 for each of first three output sample computations C1, C2 and C3. In the example of FIGS. 4 and 5, the initial value is thus 0 for the first computation C1 comprising samples −767 through −384 because sample −767 is 0, also 0 for the second computation C2 comprising samples −639 through −256 because sample −639 is 0, and 1 for the third computation C3 comprising samples −511 through −128 because sample −511 is 1. To a person skilled in the art several well-known solutions of how to establish the initial value signal IV exist.

In a further embodiment of the differentiation means DM, the differentiated input signal DIS is not established for a whole output sample computation at a time as in the above-described embodiment but rather provides an output from which the differentiated input signal DIS may easily be derived on demand, i.e. as needed by the subsequent filtering means FM. Such an embodiment is described below with reference to FIG. 6.

FIG. 6 comprises the same example input signal IS as is illustrated in FIG. 4 and for the description of this embodiment the same example values is assumed as with the previous embodiment, i.e. a two-level PWM input signal, a filter length of 384 samples and a decimation factor of 128. In the present embodiment the differentiation means comprises a first-in-first-out (FIFO) input buffer IB. The input signal IS is fed to this buffer and for each new sample arrival, the oldest sample in the input buffer is discarded. FIG. 6 illustrates the input buffer at three different times, i.e. input buffer computation one IBC1 when 384 samples have arrived and the first output sample computation begins, input buffer computation two IBC2 when 512 samples have arrived whereof the first 128 have been discarded and the second output sample computation begins, and input buffer computation three IBC3 when 640 samples have arrived whereof 256 have been discarded and the third output sample computation begins. The input buffer thus acts like a window of a certain width, corresponding to the filter length, behind which the input signal passes.

In addition to the input buffer IB, the differentiation means in this embodiment comprises a snapshot register SR. The size of this register is preferably the same as the size of the input buffer IB, i.e. 384 samples in this example. At intervals preferably corresponding to the decimation factor, i.e. 128 samples in this example, the current content of the input buffer IB is copied to the snapshot register SR. Thus, the content of the snapshot register is only changed every e.g. 128 samples.

FIG. 7 illustrates examples of the content of the snapshot register SR at the three above mentioned times. At the time of the beginning of the first computation C1, the content of the input buffer, referred to as IBC1, is copied to the snapshot register SR. Thus, input signal samples −767 through −384 are stored in the snapshot register SR. The next time the snapshot register is updated is at the time of the beginning of the second output sample computation C2, i.e. 128 samples later. The current content of the input buffer, referred to as IBC2, is copied to the snapshot register SR, thus receiving input signal samples −639 through −256. In the same way 128 samples later input signal samples −511 through −128 are copied into the snapshot register SR.

In this embodiment there is no need for the snapshot register SR or any subsequent steps to know the absolute position of each sample within the input signal. Thus, the samples in the snapshot register may as well be renumbered, e.g. as 0 through 383 in the present example. This numbering is in FIG. 7 referred to as a snapshot register count SRC. In an alternative embodiment, the snapshot register may be divided into a number of register parts analogous to the division of the differentiated input signal representing array DA into array parts AP1, AP2 and AP3 in the above-described embodiment of a differentiation means. In an embodiment as described above it may be beneficial to renumber the samples of each register part beginning from 0. A certain register part may, thus, imply a certain offset to add to the register sample counts in order to distinguish samples from different register parts.

With the present embodiment the snapshot register SR does not represent the differentiated input signal DIS but merely a snapshot of the input signal. That snapshot is, however, very useful as it for a relatively long time, i.e. 128 samples in the present example, provides access to an otherwise vanished part of the input signal. Consequently, it is possible for any subsequent circuitry or logic to process the input signal according to their own timing schemes and rate capabilities and it is possible to perform processing that requires a certain memory of otherwise past input samples. With the present invention, the filtering means FM is, thus, able to repeatedly query the snapshot register in order to obtain information about changes in the input signal instead of requiring an array with those changes furnished before the filtering process begins. The difference signal is, thus, never actually established in the present embodiment but rather calculated value by value on demand.

For deriving the changes of the input signal from the snapshot register any suitable circuitry or logic may be used, e.g. as described above with reference to the previous embodiment. Also the above notes about use of three or more level input signals, e.g. three level PWM signals, apply to the present embodiment.

The initial value signal IV may in the present embodiment be established exactly as with the above-described embodiment and thus stored in a separate register referred to as IV in FIG. 5. With the present embodiment of the invention, the initial value IV may, however, alternatively be derived from the snapshot register SR as that register comprises the real input signal values. In the example of FIGS. 6 and 7, the initial value IV to be used with a current output sample computation is always the first sample in the snapshot register, i.e. snapshot register count SRC=0 as it represents the oldest sample in the register.

Yet a further embodiment of a differentiation means DM also uses an input buffer IB as described above with reference to FIG. 6 and a snapshot register SR as described above with reference to FIG. 7. In this embodiment, however, the filtering means FM or any other subsequent circuitry need not query the snapshot register SR in order to determine the time of changes in the input signal. Instead a system of preferably logic gates and multiplexers, alternatively software or other means, is coupled to the snapshot register in order to establish a representation of the input signal changes that may be readily used by the filtering means FM.

In this embodiment of the present invention, the number of changes within the part of the input signal currently stored in the snapshot register is preferably known and even more preferably the position of each change is known to be within certain limits. Especially suitable for use with the present embodiment are, hence, input signals comprising a specific number of changes within a specific number of samples. Such a signal may, e.g., be a two-leveldouble-sided PWM signal (UADD) with a fixed PWM-period, thus comprising one change upwards in the first half of each period and one change downward in the second half of each period. When the length of snapshot register is an integer multiple of PWM periods and the PWM periods are synchronized such that the first sample of a period becomes the first sample of the snapshot register, the approximate position of each change in the snapshot register is known. When, e.g., the snapshot register comprises three PWM periods starting from the first sample, there will be one upward change among the first $\frac{1}{6}$ of the samples, one downward change among the second $\frac{1}{6}$ of the samples, etc. By means of relatively simple logics it may, thus, be possible to establish directly the position of each change and, e.g., use these positions as look-up addresses for extracting filter coefficients from a table within the filtering means FM. In the above example with 3 PWM periods within the snapshot register 6 addresses representing the 6 changes may easily be established by means of logic gates and multiplexers.

To the skilled person several other embodiments of a differentiation means DM are possible and it is noted that any suitable implementation of a differentiation means DM that establishes or provides easy access to deriving a differentiated input signal DIS and a corresponding initial value IV is within the scope of the present invention.

The filtering means FM of the present invention may be embodied in several different ways as well. As described above, the filtering means should be able to perform a convolution on the basis of a set of filter coefficients and the differentiated input signal DIS and thereto add the product of multiplying a further filter coefficient with the initial value signal IV.

In a preferred embodiment the filter coefficients to be used are pre-computed and stored in a coefficients table where they are looked up when needed by the filtering means. The coefficients may be computed and stored once, e.g., by the manufacturer, or they may be provided possibly at any time by the user or an auxiliary processing means. It is, thus, possible for a user or an artificial intelligence or regulation means to define and reconfigure the filtering according to different needs or requirements.

As described above, the coefficients may be derived by first choosing a desired filter characteristic, then establishing a set of filter coefficients by accumulating the coefficients that would correspond to the desired characteristic if conventional convolution were performed.

FIG. 8 illustrates three examples of filter characteristics illustrated by the filter coefficients to use with conventional convolution. It comprises a horizontal axis indicating the coefficient number CN, and a vertical axis indicating coefficient values CV. A first example of filter coefficients FC1, marked with circles, represents a 128-point running average finite impulse response (FIR) filter. All coefficients have the same value, i.e. $\frac{1}{128}$. This filter characteristic causes a low-pass filtering of an input signal, with a DC-gain of 1.

A second example of filter coefficients FC2, marked with diamonds, represents a 256-point weighted running average FIR filter. Actually this filter corresponds to two cascaded filters with the characteristic of the above example. It causes also a low-pass filtering with a DC-gain of 1.

A third, preferred example of filter coefficients FC3, marked with squares, represents a 384-point weighted running average FIR filter. Actually this filter corresponds to three cascaded filters of the FC1 characteristic. It also causes a low-pass filtering with a DC-gain of 1.

FIG. 9 illustrates the integrated filter coefficients IFC1, IFC2, IFC3 that should be used as filter coefficients with the filtering means FM of the present invention in order to realize the filter characteristics of the examples of FIG. 8. To achieve the filter of the first example filter coefficients FC1 of FIG. 8 the integrated filter coefficients IFC1 should be used, and accordingly the integrated filter coefficients IFC2 for obtaining the filter of the coefficients FC2, and the integrated filter coefficients IFC3 for obtaining the filter of the coefficients FC3. The integrated filter coefficients are computed simply by accumulating the filter coefficients of the examples of FIG. 8. As all filter examples have a DC-gain of 1, the last integrated filter coefficient of each filter have a coefficient value of 1. The computed filter coefficients may e.g. be stored in a look-up table for use with the convolution process. The size needed for storage of the integrated coefficients is bigger than needed for storage of the original coefficients, as the bit-width of each coefficient may be larger. As the integrated coefficients are odd symmetrical around the middle coefficient of each set, the second half of a coefficient set may be derived from the first half, e.g. by subtracting the coefficient values from 1. Thereby, in order to save storage space, it is only necessary to store the first half of a certain coefficient set, and derive coefficients from the second half when needed. This odd symmetry is however not true for all possible filter characteristics that may be used with the present invention.

FIG. 10 illustrates the effect of the three filter examples of FIGS. 8 and 9. It comprises a frequency spectrum of an example PWM signal. The signal is a two-level PWM signal. The frequency of the PWM periods is 1536 kHz, and each period is sampled with a resolution of 128 samples causing the sample rate to be 196608 kHz, i.e. 128 times 1536 kHz. From the spectrum it is seen that the PWM signal has peaks at the PWM period frequency, i.e. 1536 kHz, and the harmonics of that.

Furthermore, the frequency response of each of the filter examples of FIGS. 8 and 9 are illustrated. The filters' frequency contents are approximately the same except for the attenuation. It is clear that the performance of the third and preferred example filter is the best as it provides the best attenuation of the signal frequency peaks and still has a sufficient broad pass-band in the audio frequency range.

Designing filters for digital filtering is often a balancing between filter length and effectiveness and the intended use determines what combinations are suitable. The examples illustrated in FIG. 10 are, thus, examples of filters that are relatively short but nevertheless very effective when it comes to filtering and decimating oversampled audio signals, as they provide good attenuation in the band within 20 kHz to each side of the PWM period frequency and its harmonics, thus reducing alias errors in the audio band 0-20 kHz.

As an alternative to the above-described preferred look-up table implementation of the filter coefficients, the integrated filter coefficients may be calculated when needed. By a mathematical model the integrated filter coefficients may be approximated or even accurately represented by one or more polynomials or other mathematical functions. Any time a filter coefficient is needed it may be derived from the mathematical model. Thereby, no storage space is needed for the look-up table and the filter characteristic may yet be user-definable by allowing the model to be changed. The integrated filter coefficients IFC3 from the third filter example of FIGS. 8 and 9 may, e.g., be modeled by three different third order polynomials. For integrated filter coefficients 0 through 127 a first polynomial is used, for coefficients 128 through 255 a second polynomial is used, and for coefficients 256 through 383 a third polynomial is used. Analogous to the description above on odd symmetry and the look-up table, the third polynomial need not be used, as the third group of coefficients may be derived from the first polynomial. As stated above this is not true for any possible filter characteristic.

The convolution of the differentiated input signal DIS with the filter coefficients may be performed and, thus, implemented in several ways according to the implementation of the differentiated input signal DIS and the filter coefficients. The convolution technique is, however, straightforward and the skilled person has several well-known solutions to choose a suitable implementation from.

The filtering means FM is described above with examples of FIR-filters but it may as well perform other kinds of digital filtering, in particular infinite impulse response filtering also referred to as IIR-filtering.

Even though the impulse response of IIR-filters by nature are infinite an embodiment of the present invention may facilitate IIR-filtering on the basis of a model of a desired filters step-response from which the state of the filter may be calculated for any sample. This is especially advantageously facilitated when the input signal is an infrequently changing signal.

For, e.g., a first order low-pass IIR filter represented in the frequency domain by H(s):

$$H(s) = \frac{a}{s+a}$$

where a represents a pole,
the step-response r(t) may be described as:

$$r(t) = 1 - e^{-t \cdot a}$$

To use the step-response representation for filtering an infrequently changing input signal, the output signal value at the time of each change may be calculated from the step-response as well as the output values between the changes.

With the above first-order example the output values os(ct) at the times ct of input signal changes may for a two-level input signal be calculated as this:

$$os(ct) = os(ct_{-1}) + (d - os(ct_{-1})) \cdot (1 - e^{-(ct - ct_{-1}) \cdot a}),$$

where $ct_{-1}$ denotes the time of the previous change and d denotes the input signal value before the change at ct, e.g. 1 or 0.

Accordingly, the output signal values os(t) at times between the changes may for a two-level input signal be calculated as this:

$$os(t) = os(ct_{-1}) + (d - os(ct_{-1})) \cdot (1 - e^{-(t - ct_{-1}) \cdot a}),$$

where $ct_{-1}$ denotes the time of the most recent change and d denotes the input signal value at the time t, e.g. 1 or 0.

For IIR filters of higher orders the modeling and calculations are more complicated but yet possible and within the scope of the present invention. One possible solution would be to express a higher order filter by partial fractions in order to obtain a set of first order filters. By parallel calculation of the output of these first order filters and adding together the outputs, the output of the higher order filter is determined.

It is noted that any representation of the step-response of an IIR filter is within the scope of the present invention. The representation may, e.g., comprise expressions as shown above or pre-calculation of the expressions to establish a table of possible outcomes of parts of the expressions.

According to the theoretical reasoning above regarding FIR filtering, the filtering means is in a preferred embodiment of the invention adapted to perform an operation like this derived from equation EQ3:

$$y[n] = \sum_{k=0}^{N-2} (l[k] \cdot x'[n-k]) + l[N-1] \cdot x[n-(N-1)]$$

As also reasoned above the last of the integrated filter coefficients l[N−1] is 1 for any filter with a DC-gain of 1. In such preferred circumstances the operation may be reduced into the following by simply omitting l[N−1]:

$$y[n] = \sum_{k=0}^{N-2}(l[k]\cdot x'[n-k]) + x[n-(N-1)]$$

Also as reasoned above x'[n−k] is zero for the most of the input signal samples as long as the input signal is an infrequently changing signal. For each difference signal value that is zero a multiplication and an addition may be spared.

If the input signal is a two-level signal as preferred, e.g. a two-level PWM signal, all non-zero difference signal values are either +1 or −1, thus practically allowing the x'[n−k] to be omitted and instead just assigning the proper sign to the corresponding integrated filter coefficient l[k]. In cases with more input signal levels this omission is not permitted and the difference signal values have to be used in the operation.

If the differentiated input signal DIS is provided as, e.g., in the embodiment described with reference to FIGS. 4 and 5, i.e. the input signal change times and directions being directly provided, the differentiated input signal DIS may be used directly for looking up or calculating the needed filter coefficient values.

On the basis of the example input signal IS of FIG. 4 the thereof derived differentiated input signal representing array DA of FIG. 5 and the third example integrated filter coefficient set IFC3 of FIG. 9, the operation of the filtering means FM for the first 3 output samples OS may look like the following. The coefficient values have been rounded off due to clearance:

For the first computation C1:

OS[0]=l[383−14]−l[383−61]+l[255−15]−l[255−78]+
l[255−119]−l[127−47]+l[127−81]+0

The last zero is the initial value IV and the indexes from the array parts AP1, AP2 and AP3 are subtracted from offsets of 383, 255 and 127 as described. By looking the coefficients up the following may be established:

OS[0]=0.9998−0.9828+0.7731−0.4242+0.2086−
0.0438+0.0088+0

Which results in the first output sample being:

OS[0]=0.5395

For the second computation C2:

OS[1]=l[383−15]−l[383−78]+l[383−119]−l[255−
47]+l[255−81]−l[127−16]+l[127−83]+0

The initial value IV is zero again. Looking up the coefficients gives:

OS[1]=0.9998−0.9637+0.8694−0.6045+0.4069−
0.1147+0.0077+0

Which results in the second output sample being:

OS[1]=0.6009

For the third computation C3:

OS[2]=−l[383−47]+l[383−81]−l[255−16]+l[255−
83]−l[127−12]+l[127−59]l[127−120]+1

The initial value IV is 1 this time. Looking up the coefficients gives:

OS[2]=−0.9923+0.9593−0.7684+0.3955−0.1273+
0.0273−0.0001+1

Which results in the third output sample being:

OS[2]=0.4940

If alternatively the differentiated input signal DIS is to be derived from a snapshot register SR as described above with reference to FIGS. 6 and 7, the filtering means FM have to go through that register and look for changes. For every change found a coefficient lookup is performed and the coefficient added or subtracted from an intermediate result according to the direction of the change. Eventually, the first sample of the register, i.e. the initial value IV, is added to the intermediate result, which may then be output as an output sample. Alternatively, the intermediate result may be initialized with the initial value and then have coefficients added or subtracted while going through the snapshot register.

The differentiation means DM and filtering means FM may be implemented in any suitable way, e.g. by means of software running on a micro-processor, a digital signal processor or any other kind of software-executing hardware, or by means of hardware in the form of dedicated microchips, user-definable microchips, suitable combinations of logical gates or any other hardware means. The present invention may as well be implemented as a combination of software and hardware means.

FIG. 11 illustrates an example of an application where the fast filtering means FFM of the present invention as described above may advantageously be used. The figure illustrates a power supply compensation means for compensating power supply errors mainly in digital amplifiers using switching means in the power stage. The power supply compensation means is further disclosed in the PCT patent application PCT/DK03/00688 "Power supply compensation", hereby incorporated by reference. In that document the so-called decimation means (DM) may advantageously be substituted by the present invention, a fast filtering means FFM.

FIG. 11 comprises an input utility signal IUS, preferably a PCM-signal, which via a compensated input signal CIS is transformed into an output utility signal OUS by an amplification means AM. The amplification means AM is connected to a power supply means PSM via a power signal PS.

The amplification means AM is preferably a PWM amplifier comprising PCM-to-PWM conversion means and power switching means but may be any amplifier, filter or processing function where the input signal CIS undergoes processing with a multiplicative relationship with the power supply voltage. Such relationship causes changes in the power supply voltage to cause changes in the amplitude of the output signal OUS. As the utility data of a PWM signal is comprised by the combination of the, preferably, constant amplitude and the widths of the pulses, noise is introduced into the signal when the amplitude is changed unintentionally.

As PWM amplifiers are often used in low cost applications utilizing their high efficiency compared to their cost it would be unconstructive to use highly specialized, sophisticated and expensive power supplies with minimal error and instead of such a power supply the application of FIG. 11 may be provided to compensate for errors in a more cost-effective, less enhanced power supply.

FIG. 11 further comprises a compensation means CM also connected to the power signal PS in order to monitor the power supply voltage. The compensation means CM establishes on the basis of the power signal PS a pulse width modulated compensation signal PWCS. This signal represents by means of a PWM encoding substantially the reciprocal of the currently applied power supply voltage and is the value by which the input utility signal IUS currently should be multiplied in order to compensate for the shortcoming power supply. However, some modulation and encoding differences, in particular different sample rates, prevent the PWM compensation signal PWCS from being used directly for multiplication with the input signal.

Hence, the preferably high-frequency pulse width modulated compensation signal PWCS may be decimated and in this connection low-pass filtered by means of the present invention, a fast filtering means FFM. The output of the fast filtering means FFM is a pulse code modulated compensation signal PCCS. This signal may represent values in the same format, i.e. encoding and rate, as the input utility signal, thus, facilitates multiplication of the two signals.

The pulse code modulated compensation signal PCCS, however, suffers from a further problem in most embodiments and applications as the time used for, e.g., the PWM-conversion, filtering and decimation causes the value represented by the PCM compensation signal PCCS to be outdated relative to the current input utility signal IUS. This may be overcome by an extrapolation means EM inserted subsequently to the fast filtering means FFM. On the basis of the PCM compensation signal PCCS and extrapolation, prediction or another useful method, it should establish an extrapolated compensation signal CS that probably more accurately corresponds in time to the input value currently represented by the input utility signal IUS.

Eventually, the compensation signal CS is applied to the input utility signal IUS by means of a multiplication point MP, thus modifying the input utility signal IUS into a compensated input signal CIS. Thus, the compensation signal CS is fed to the amplification means AM via the compensated input signal CIS.

FIG. 12 illustrates a further example of an application where the present invention may be utilized with advantage. The application is a PCM-to-PWM converter with error-compensation means, e.g. for use in a digital amplifier. The application of FIG. 12 may, e.g., be used within the amplification means AM of the application in FIG. 11 where nonlinearities may inherently occur when converting from PCM signals to PWM signals.

FIG. 12 comprises a PCM input signal PCMI, e.g. an audio signal representation which via a delay DL and a summing point is fed to a first PCM-to-PWM mapping means PPM1. The mapping means establishes a digital model of a PWM signal corresponding to the PCM input signal. Several suitable PCM-to-PWM mapping means exist in the prior art for the skilled person to choose from. The PWM signal model is then quantized and, preferably, noise-shaped by a quantizing and noise-shaping means QN. Thereby, conversion errors, e.g. quantization errors, are minimized. The PWM model is finally fed to a pulse generator PG in order to establish a PWM output signal POS.

Furthermore, in order to improve the accuracy of the PCM-to-PWM converter it would be desirable to establish a feedback path from the output signal. But because of nonlinear elements and signal incompatibilities, e.g. in relation to domains (digital/analogue) and modulation (PCM/PWM), this may be very problematical or even impossible.

The application of FIG. 12 takes a different approach in that it provides a model of the above-described blocks whereby it is possible to calculate a possible error in advance and perform pre-compensation of the input signal according thereto.

Thus, the PCM input signal PCMI is, furthermore, fed to a second PCM-to-PWM mapping means PPM2. This second mapping means should, preferably, establish a result substantially equal to the result of the first mapping means PPM1 but it need not, however, be exactly the like component. The first intermediate model SM1 produced by the second mapping means PPM2 is fed to a pulse generator model PGM, thereby establishing a second intermediate model SM2. The pulse generator model should, preferably, establish a PWM representation substantially equal to what the pulse generator PG would establish but it should, preferably, keep the representation in a digital form, preferably with a very high time resolution, i.e. a sample rate of, e.g., 200 MHz. The second intermediate model IM2 is fed to a fast filtering means FFM according to the present invention in order to low-pass filter and decimate the second intermediate model IM2 into an output signal estimate OSE in a format, i.e. in relation to domain and modulation, comparable to the PCM input signal PCMI.

By subtracting the input signal PCMI from the output signal estimate OSE an error estimate EE representing the error that may expectedly be introduced by the subsequent PCM-to-PWM conversion chain may be established. In order to subtract corresponding signal values, a delay DL is inserted in the input signal PCMI path. As the fast filtering means FFM, preferably, performs finite impulse response filtering (FIR-filtering) the total propagation delay through the three blocks second PCM-to-PWM mapping means PPM2, pulse generator model PGM and fast filtering means FFM is substantially fixed, thus allowing a simple, fixed delay for use as delay DL.

When the error estimate EE is established it may be subtracted from the PCM input signal PCMI in order to establish a compensated PCM signal CPM. Thus, this signal is pre-compensated for the aggregated errors introduced and not corrected within the first PCM-to-PWM mapping means PPM1 and the pulse generator PG.

The fast filtering means FFM of the present invention may be used with advantage in the application of FIG. 12 due to its very fast filtering method when used with infrequently changing signals allowing it to be used for filtering and decimation of very fast signals.

In an alternative embodiment of the application of FIG. 12, a model of the quantizing and noise-shaping means QN is also comprised in the compensation path but the embodiment of FIG. 12 is preferred as the quantizing and noise-shaping means QN is preferably a linear element and, thus, does not inject errors which may be compensated by the compensation means of the application illustrated in FIG. 12.

The invention claimed is:

1. Hardware implemented filtering method comprising:
    establishing a representation of a derivative of at least a part of a time-quantized pulse width modulated input signal, and
    establishing at least one sample of a time- and amplitude-quantized pulse code modulated output signal by performing filtering on the basis of at least a part of a filter representation and said representation of the derivative of at least a part of said input signal;
    whereby said performing filtering is arranged to omit arithmetic operations involving such samples of said representation of the derivative of at least a part of said input signal that are derived from identically valued contiguous samples of said time-quantized input signal.

2. Hardware implemented filtering method according to claim 1, whereby said establishing at least one sample of a time- and amplitude-quantized output signal is implemented according to a hardware implemented method of convolving in a time domain an input signal with an impulse response in order to establish an output signal, comprising:
    providing said output signal at least partly by a convolution in the time domain of a difference signal representation of said input signal and a sum representation of said impulse response.

3. Hardware implemented filtering method according to claim 2, whereby said impulse response is finite.

4. Hardware implemented filtering method according to claim 1, whereby said time-quantized input signal comprises in average at least 10 samples for each input signal value change.

5. Hardware implemented filtering method according to claim 1, whereby said establishing a representation of the derivative of at least a part of said time-quantized input signal comprises establishing a sequence of differences between successive samples of said at least a part of said input signal.

6. Hardware implemented filtering method according to claim 1, whereby said at least a part of said time-quantized input signal in respect of its length corresponds to the length of said at least a part of an impulse response.

7. Hardware implemented filtering method according to claim 1, whereby said representation of the derivative of at least a part of said time-quantized input signal is stored in a differentiated input signal representing array.

8. Hardware implemented filtering method according to claim 1, whereby said establishing a representation of the derivative of at least a part of a time-quantized input signal comprises indexing corresponding times and directions of amplitude changes of said at least a part of said input signal.

9. Hardware implemented filtering method according to claim 1, whereby the length of said at least a part of said filter representation is an integer multiple of the length of a symbol of said at least a part of said time-quantized input signal.

10. Hardware implemented filtering method according to claim 1, whereby a number of changes within a symbol of said at least a part of said time-quantized input signal is constant.

11. Hardware implemented filtering method according to claim 1, whereby said times are indexed relative to each other.

12. Hardware implemented filtering method according to claim 1, whereby said establishing a representation of the derivative of at least a part of a time-quantized input signal comprises storing into a snapshot register said at least a part of said time-quantized input signal.

13. Hardware implemented filtering method according to claim 1, whereby said establishing a representation of the derivative of at least a part of a time-quantized input signal comprises querying said snapshot register regarding input signal changes.

14. Hardware implemented filtering method according to claim 1, whereby said at least a part of said filter representation is a sum representation of at least a part of an impulse response.

15. Hardware implemented filtering method according to claim 1, whereby said at least a part of said filter representation is predetermined.

16. Hardware implemented filtering method according to claim 1, whereby said at least a part of said filter representation is implemented by means of at least one filter coefficient.

17. Hardware implemented filtering method according to claim 1, whereby said at least a part of said filter representation is implemented by means of at least one model, comprising at least one polynomial.

18. Hardware implemented filtering method according to claim 1, whereby said implementation of said at least a part of said filter representation is adapted to utilize any symmetry of said filter representation.

19. Hardware implemented filtering method according to claim 1, whereby said at least a part of said filter representation is user-adjustable.

20. Hardware implemented filtering method according to claim 1, whereby said performing filtering comprises convolving said at least a part of said filter representation with said representation of the derivative of at least a part of said time-quantized input signal.

21. Hardware implemented filtering method according to claim 20, whereby said convolving said at least a part of said filter representation with said representation of the derivative of at least a part of said time-quantized input signal is performed for only some of the samples of said time-quantized input signal.

22. Hardware implemented filtering method according to claim 1, whereby said performing filtering further comprises for each of said at least one sample of a time- and amplitude-quantized output signal adding the result of multiplying an initial value of said at least a part of said time-quantized input signal with a value of said at least a part of said filter representation.

23. Hardware implemented filtering method according to claim 1, whereby said performing filtering further comprises adding, for each of said at least one sample of a time- and amplitude-quantized output signal, an initial value of said at least a part of said time-quantized input signal.

24. Hardware implemented filtering method according to claim 1, whereby said performing filtering comprises exercising the expression $$y[n] = \sum_{k=0}^{N-2} (l[k] \cdot x'[n-k]) + l[N-1] \cdot x[n-(N-1)],$$

where y[n] represents said at least one sample of a time- and amplitude-quantized output signal, x[n] represents said at least a part of said time-quantized input signal, x'[n] represents said representation of the derivative of x[n], l[k] represents said at least a part of said filter representation, N represents the length of l[k].

25. Hardware implemented filtering method according to claim 1, whereby said performing filtering further comprises performing conventional filtering.

26. Hardware implemented filtering method according to claim 1, whereby a sample rate of said time- and amplitude-quantized output signal is different from a sample rate of said time-quantized input signal.

27. Hardware implemented filtering method according to claim 1, whereby a sample rate of said time- and amplitude-quantized output signal corresponds to a symbol rate of said time-quantized input signal.

28. Hardware implemented filtering method according to claim 1, whereby said filter representation comprises a sum representation of a low-pass filter.

29. Hardware implemented filtering method according to claim 1, whereby said method is exercised in real time.

30. Hardware implemented filtering method according to claim 1, whereby said at least a part of a filter representation represents at least a part of an impulse response.

31. Hardware implemented filtering method according to claim 1, whereby said at least a part of a filter representation represents the derivative of at least a part of an impulse response.

32. Hardware implemented filtering method according to claim 1 further comprising the step of
integrating at least once said time- and amplitude-quantized output signal.

33. Hardware implemented decimation method for decimating a time-quantized pulse width modulated input signal comprising:

dividing said time-quantized input signal into intervals, for each of said intervals establishing a sample of a time- and amplitude-quantized pulse code modulated output signal by performing filtering on the basis of at least a part of a filter representation and a representation of a derivative of at least a part of said input signal;

whereby said performing filtering is arranged to omit arithmetic operations involving such samples of said representation of the derivative of at least a part of said input signal that are derived from identically valued contiguous samples of said time-quantized input signal.

34. A filter arrangement comprising:

a differentiator for establishing a representation of a derivative of at least a part of a time-quantized pulse width modulated input signal, and a filtering unit for establishing at least one sample of pulse code modulated output signal by performing filtering on the basis of at least a part of a filter representation and said representation of the derivative of at least a part of said input signal;

wherein said filtering unit is arranged to omit arithmetic operations involving such samples of said representation of the derivative of at least a part of said input signal that are derived from identically valued contiguous samples of said time-quantized input signal.

* * * * *